(12) United States Patent
Nangoy

(10) Patent No.: US 7,433,759 B2
(45) Date of Patent: Oct. 7, 2008

(54) APPARATUS AND METHODS FOR POSITIONING WAFERS

(75) Inventor: Roy C. Nangoy, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 782 days.

(21) Appl. No.: 10/898,301

(22) Filed: Jul. 23, 2004

(65) Prior Publication Data

US 2006/0020367 A1 Jan. 26, 2006

Related U.S. Application Data

(60) Provisional application No. 60/590,607, filed on Jul. 22, 2004.

(51) Int. Cl.
*G06F 19/00* (2006.01)

(52) U.S. Cl. .............. 700/245; 700/218; 700/255; 700/258; 700/259; 414/754; 414/757; 414/777; 414/783; 414/816; 318/568.16; 318/640; 901/16; 901/47; 73/866.5; 198/394

(58) Field of Classification Search ............ 700/218, 700/245, 255, 258, 259; 414/754, 757, 777, 414/783, 816, 936, 941; 318/568.1, 568.11, 318/568.12, 568.15, 568.16, 568.21, 568.22, 318/640, 570, 574; 901/6, 16, 47; 73/856.9, 73/866.5; 198/394

See application file for complete search history.

(56) References Cited

U.S. PATENT DOCUMENTS

| | | | |
|---|---|---|---|
| 4,819,167 A | 4/1989 | Cheng et al. | |
| 5,308,222 A * | 5/1994 | Bacchi et al. | 414/783 |
| 5,483,138 A | 1/1996 | Shmookler et al. | |
| 5,511,934 A * | 4/1996 | Bacchi et al. | 414/783 |
| 5,513,948 A * | 5/1996 | Bacchi et al. | 414/783 |
| 5,740,062 A | 4/1998 | Berken et al. | |
| 5,905,850 A | 5/1999 | Kaveh | |
| 5,980,194 A | 11/1999 | Freerks et al. | |
| 6,244,121 B1 | 6/2001 | Hunter | |
| 6,323,616 B1 * | 11/2001 | Sagues et al. | 318/568.11 |
| 6,357,996 B2 * | 3/2002 | Bacchi et al. | 414/754 |
| 6,405,101 B1 | 6/2002 | Johanson et al. | |

* cited by examiner

*Primary Examiner*—Khoi H. Tran
*Assistant Examiner*—Mcdieunel Marc
(74) *Attorney, Agent, or Firm*—Fish & Richardson

(57) ABSTRACT

A method for calibrating a controller of a robotic arm in a microelectronics manufacturing apparatus that includes storing a default position for an edge detector, moving a blade on the robotic arm based on the default position of the edge detector such that at least three edge points on the blade pass through and are detected by the edge detector, generating a plurality of arm position measurements from an arm position sensor by measuring a position with the arm position sensor of the robotic arm at each position of the robotic arm at which an edge point of the blade is detected by the edge detector, and determining at least one of an actual position of the edge detector and an offset for measurements of the arm position sensor based on the plurality of arm position measurements.

45 Claims, 10 Drawing Sheets

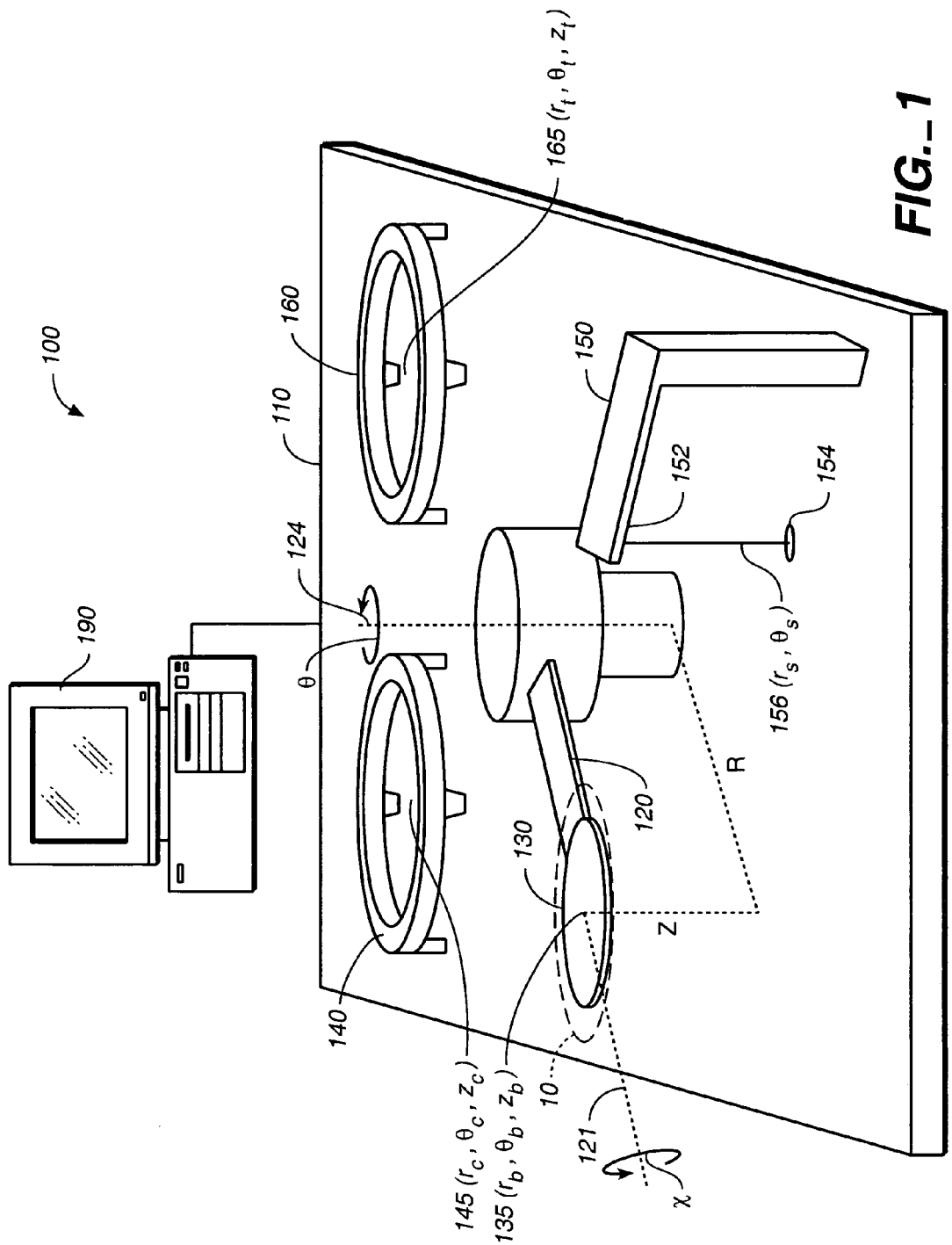
FIG._1

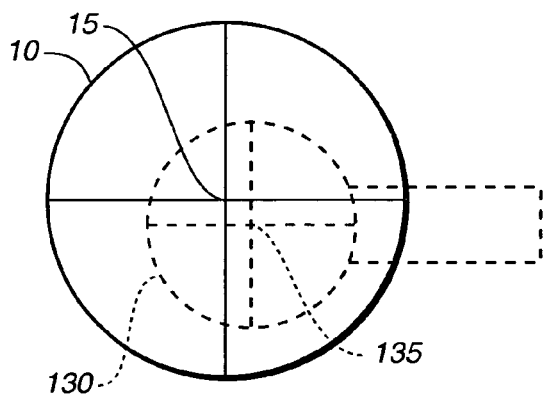
FIG._2a
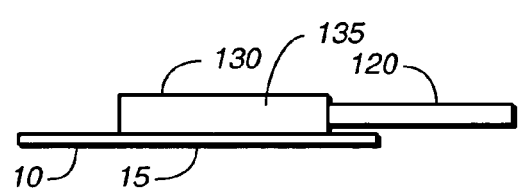
FIG._2b
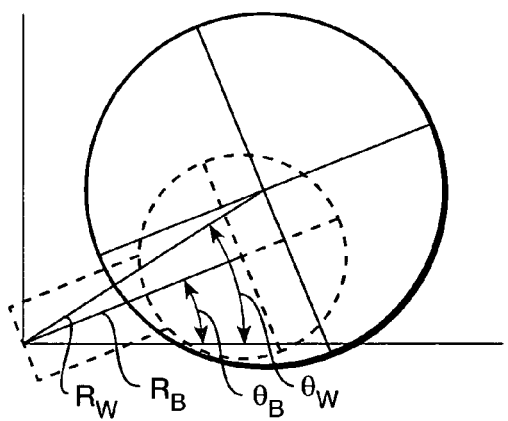
FIG._2c

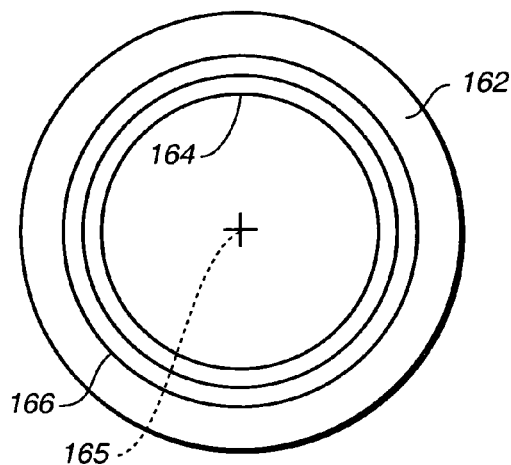
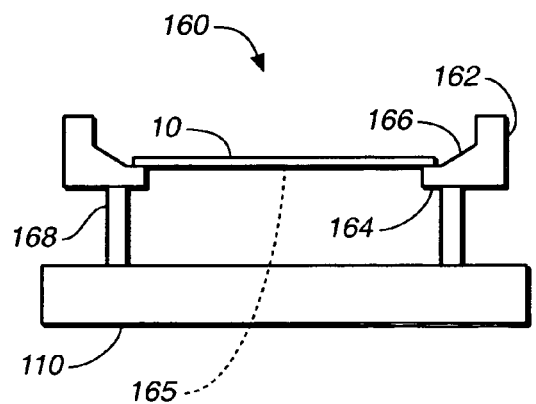
FIG._3a  FIG._3b
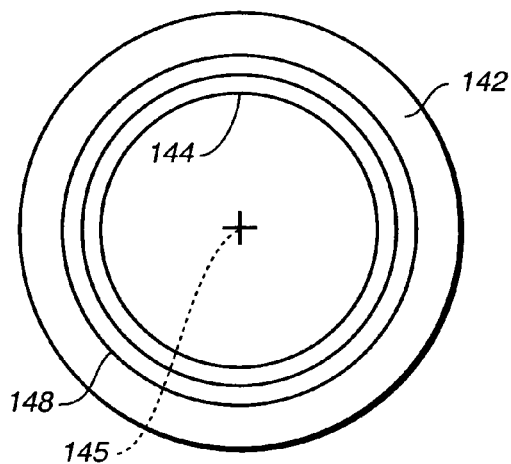
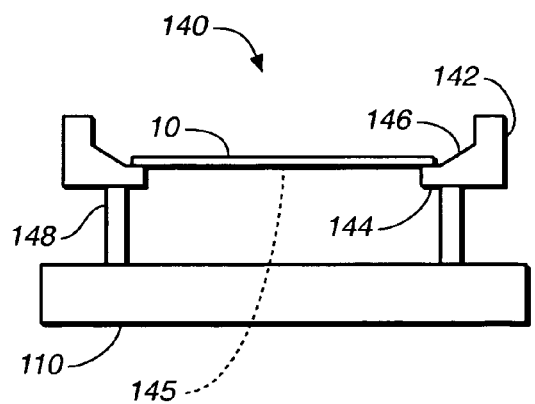
FIG._4a  FIG._4b

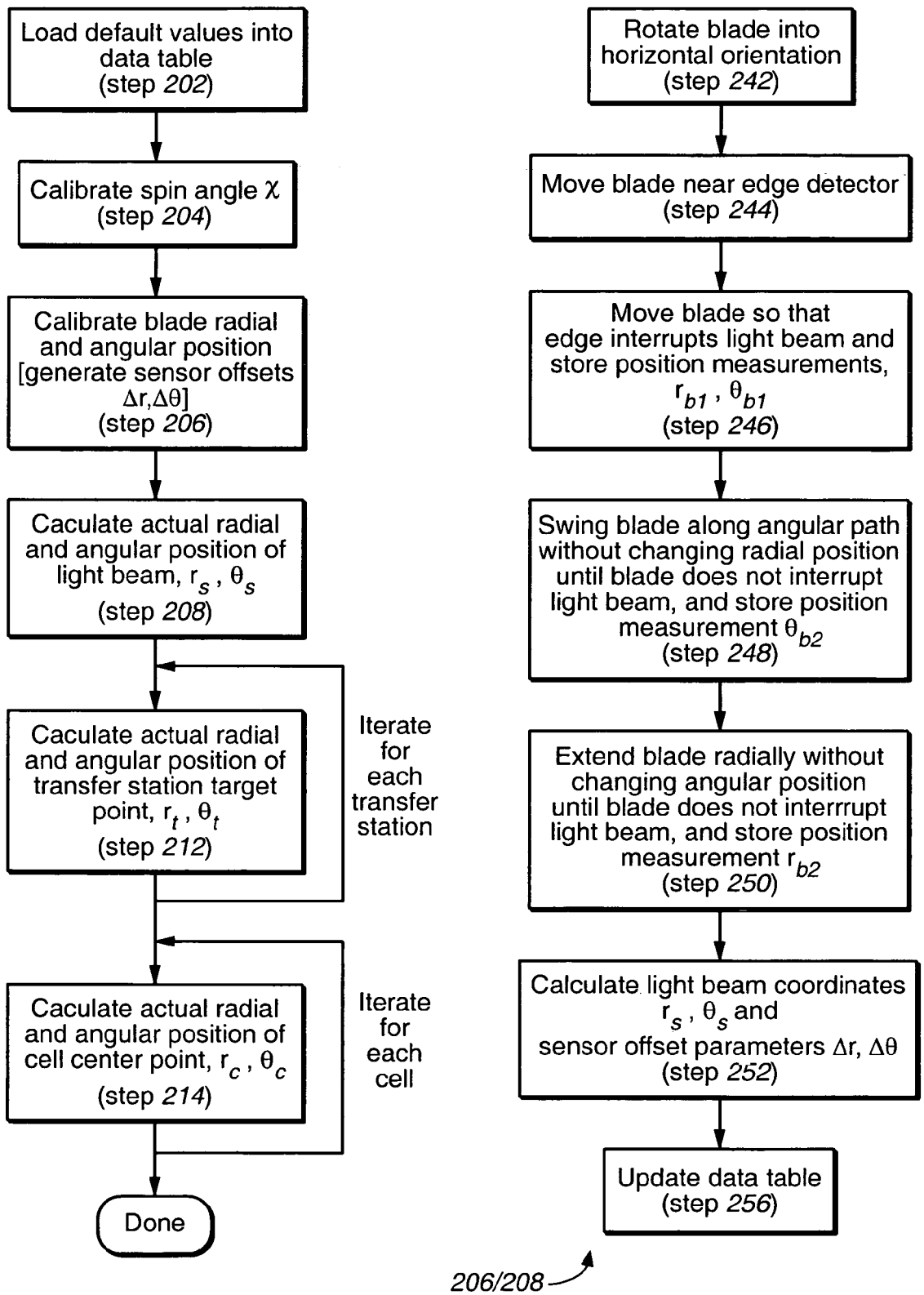
FIG._5    FIG._8

| Cell position | $R'_c$ | $\theta'_c$ | $Z'_c$ |
|---|---|---|---|
| Transfer station position | $R'_t$ | $\theta'_t$ | $Z'_t$ |
| Edge sensor position | $R'_s$ | $\theta'_s$ | N/A |
| Sensor offset parameters | 0 | | 0 |
192
FIG._6
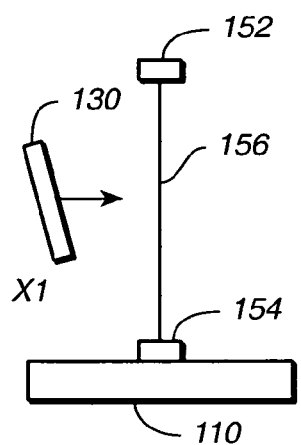
FIG._7a
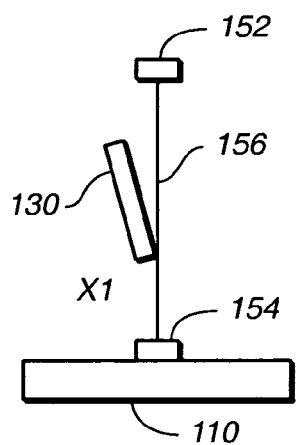
FIG._7b
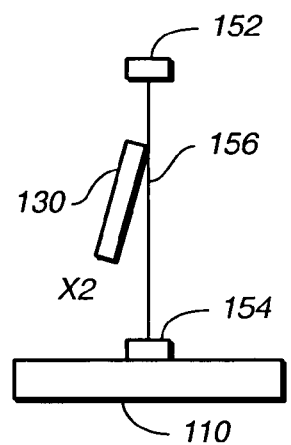
FIG._7c

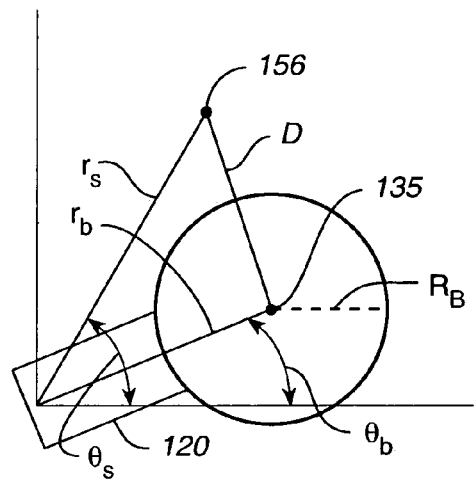
FIG._9a
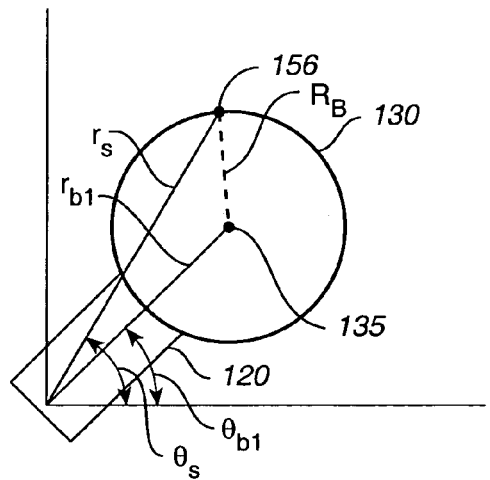
FIG._9b
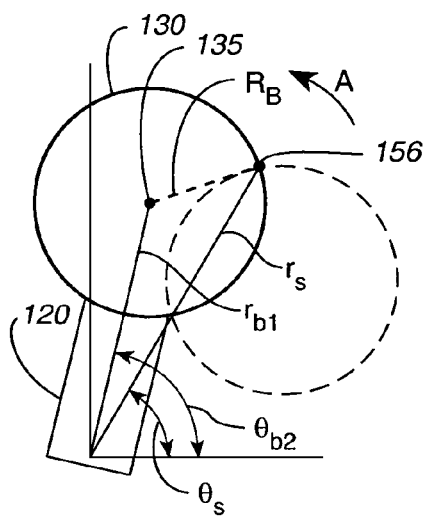
FIG._9c
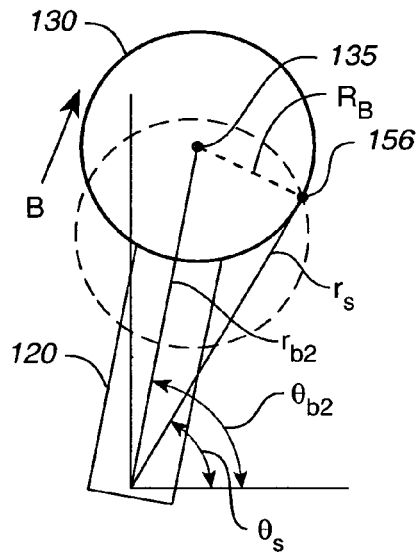
FIG._9d
| Cell position | $R'_c$ | $\theta'_c$ | $Z'_c$ |
|---|---|---|---|
| Transfer station position | $R'_t$ | $\theta'_t$ | $Z'_t$ |
| Edge sensor position | $r_s$ | $\theta_s$ | N/A |
| Sensor offset parameters | $\Delta r$ | $\Delta\theta$ | 0 |
192
FIG._10

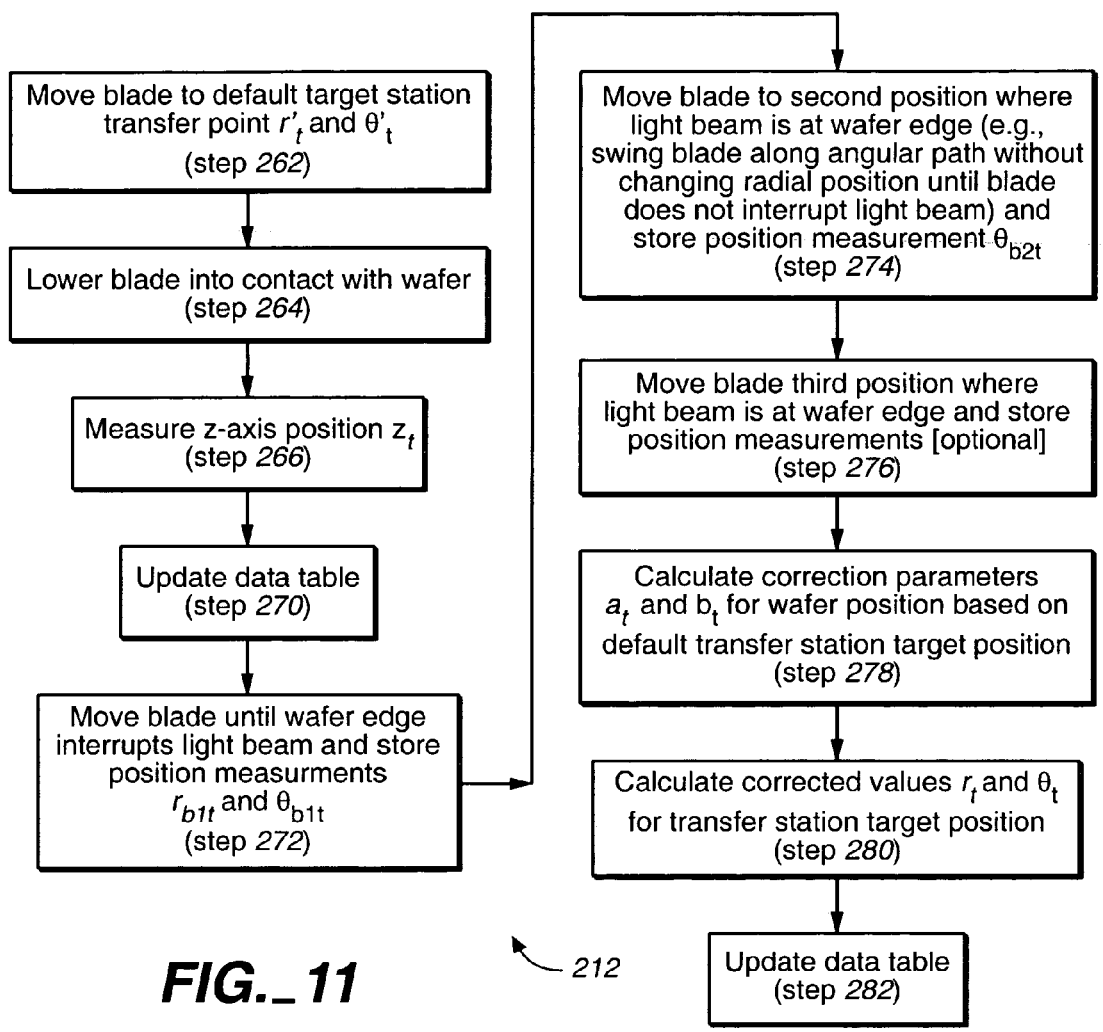
FIG._11
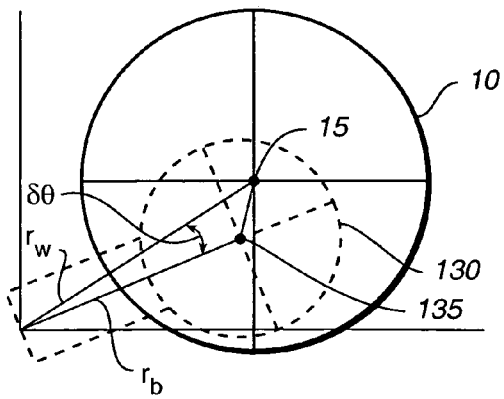
FIG._12a
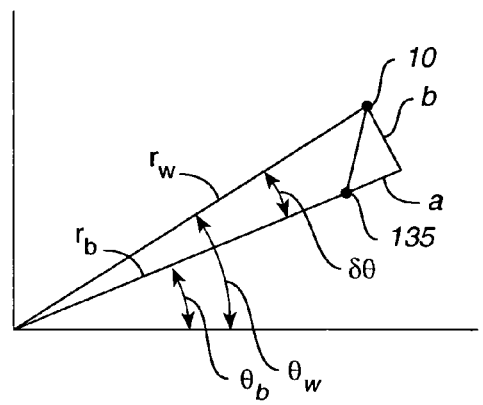
FIG._12b

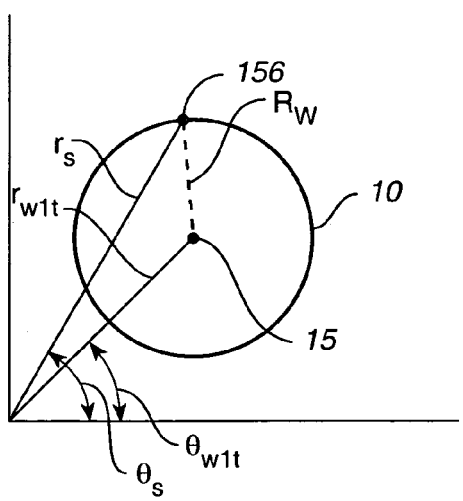
FIG._13a
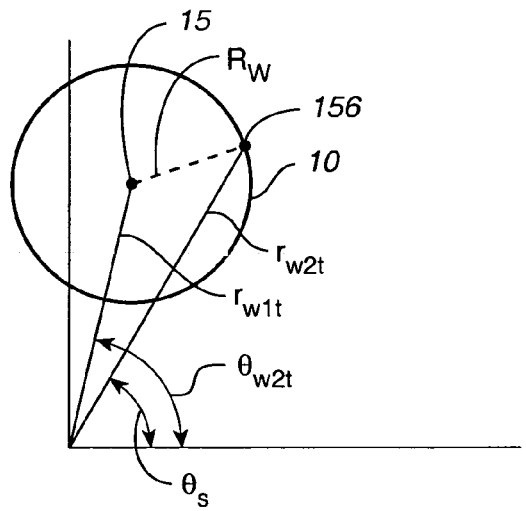
FIG._13b
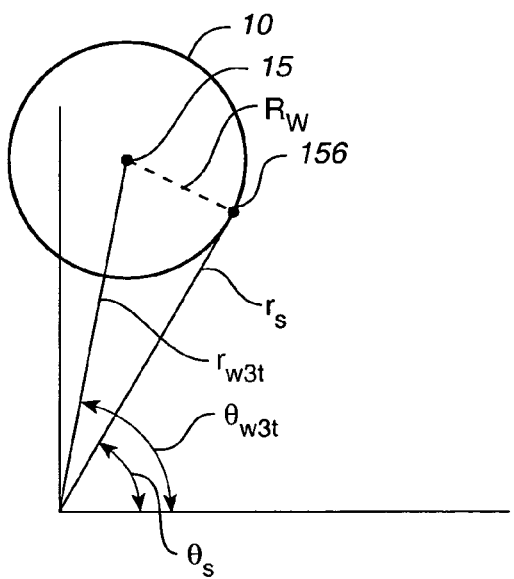
FIG._13c
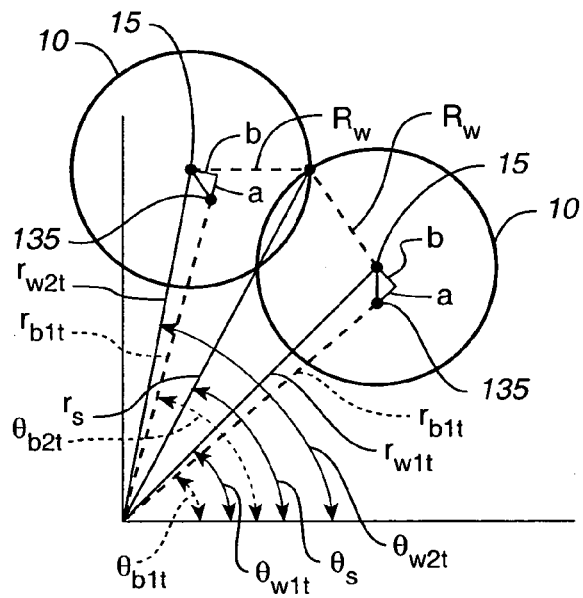
FIG._14
| Cell position | $R'_c$ | $\theta'_c$ | $Z'_c$ |
| --- | --- | --- | --- |
| Transfer station position | $R_t$ | $\theta_t$ | $Z_t$ |
| Edge sensor position | $r_s$ | $\theta_s$ | N/A |
| Sensor offset parameters | $\Delta r$ | $\Delta\theta$ | 0 |
192
FIG._15

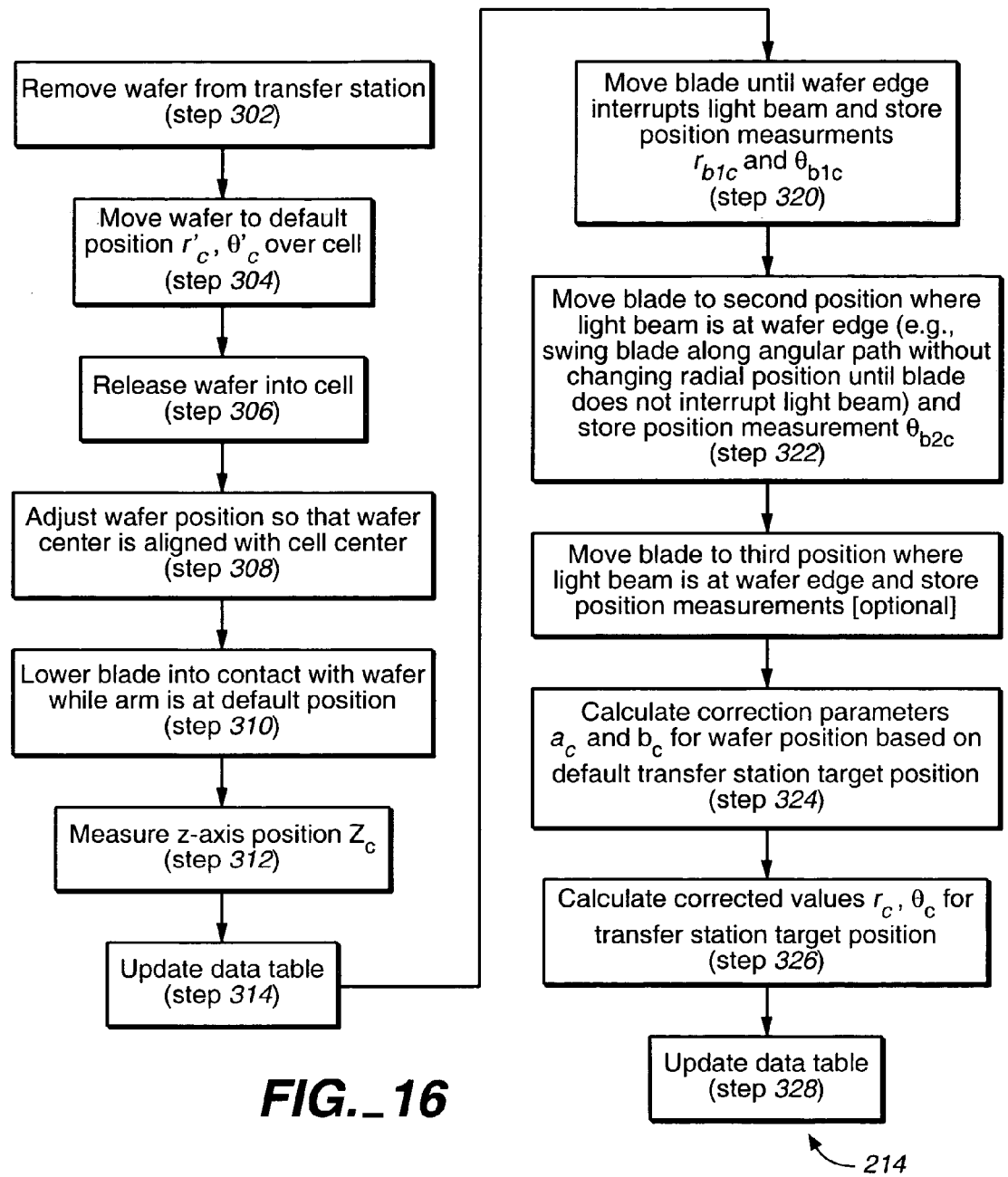
FIG._16
| Cell position | $R_c$ | $\theta_c$ | $Z_c$ |
| --- | --- | --- | --- |
| Transfer station position | $R_t$ | $\theta_t$ | $Z_t$ |
| Edge sensor position | $r_s$ | $\theta_s$ | N/A |
| Sensor offset parameters | $\Delta_r$ | $\Delta\theta$ | 0 |
FIG._17

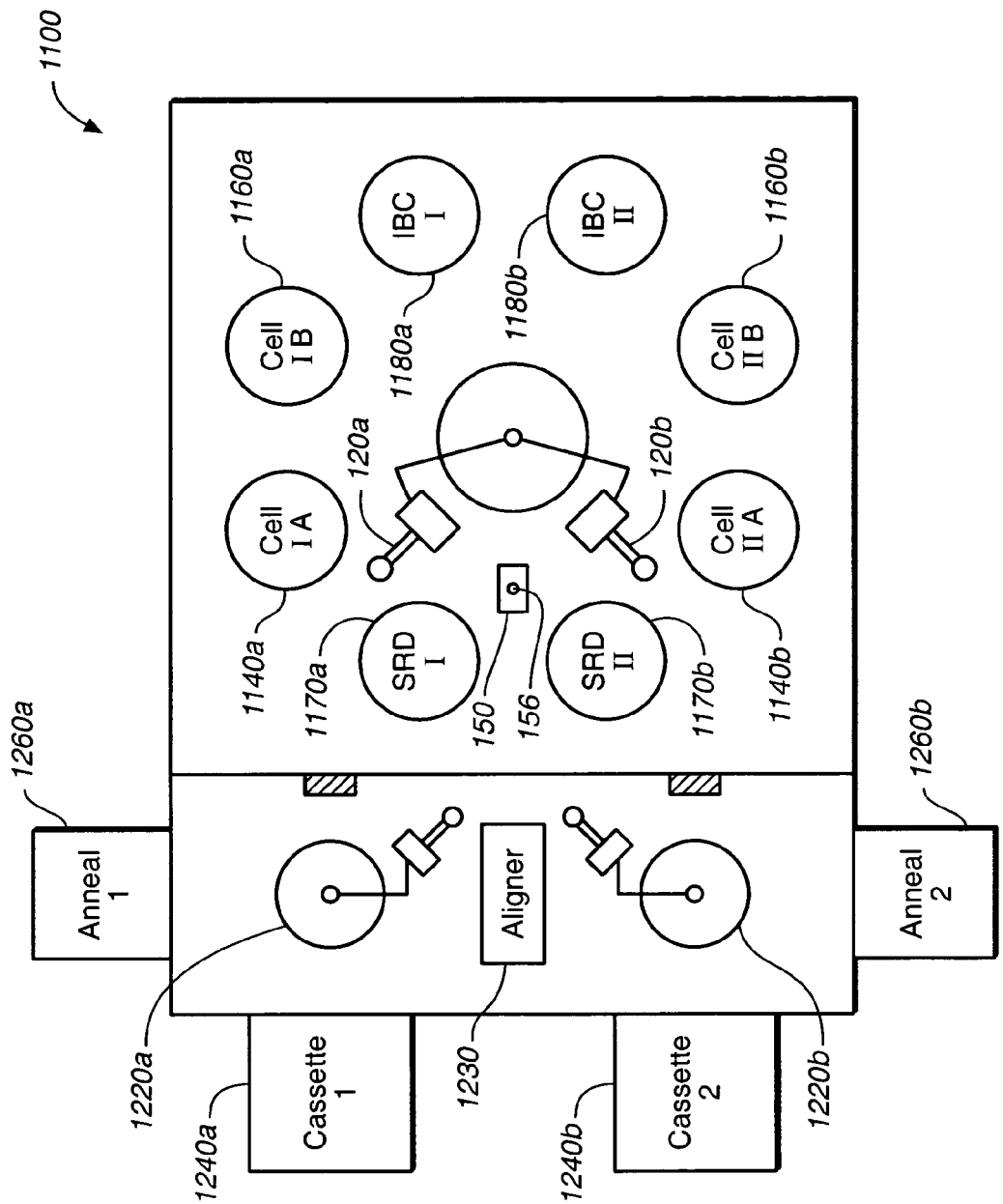
FIG._18

APPARATUS AND METHODS FOR POSITIONING WAFERS

This application claims priority to U.S. application Ser. No. 60/590,607, filed on Jul. 22, 2004.

BACKGROUND OF THE INVENTION

The present invention relates generally to microelectronics manufacturing technology.

Microelectronic devices are commonly manufactured on wafers. Microelectronic manufacturing generally involves many processes. Some of the example processes include: evaporation, sputtering, plasma vapor deposition, chemical vapor deposition, plasma etching, electrochemical plating ("ECP"), and chemical mechanical polishing ("CMP"). During some of these manufacturing processes, wafers are moved from one position to another by robotic arms. For example, in ECP, the wafers are moved between electroplating cells, cleaning stations, and wafer transfer stations. The robotic arms are generally controlled by robot controllers, such as computers. Sometimes, for a robotic arm to place a wafer on a wafer cell, the robotic arm may need to be calibrated or the position of the wafer cell be measured. Some of the calibrations and measurements need to be done manually by the equipment operators.

SUMMARY OF THE INVENTION

In one aspect, the invention is directed to a method for calibrating a controller of a robotic arm in a microelectronics manufacturing apparatus. The method includes storing a default position for an edge detector, moving a blade on the robotic arm based on the default position of the edge detector such that at least three edge points on the blade pass through and are detected by the edge detector, generating a plurality of arm position measurements from an arm position sensor by measuring a position with the arm position sensor of the robotic arm at each position of the robotic arm at which an edge point of the blade is detected by the edge detector, and determining at least one of an actual position of the edge detector and an offset for measurements of the arm position sensor based on the plurality of arm position measurements.

In another aspect, the invention is directed to a method for calibrating a controller of a robotic arm in a microelectronics manufacturing apparatus. The method includes storing a default position for a station, picking up a substrate from the station with the blade of the robotic arm based on the default position of the station, moving the blade on the robotic arm such that at least three edge points on the substrate pass through and are detected by an edge detector, generating a plurality of arm position measurements from the arm position sensor by measuring a position with the arm position sensor of the robotic arm at each position of the robotic arm at which an edge point of the substrate is detected by the edge detector, and determining an actual position of the station based on the plurality of arm position measurements.

In another aspect, the invention is directed to a computer product tangibly embedded on a storage medium for calibrating a controller of a robotic arm in a microelectronics manufacturing apparatus, the computer product comprising instructions to carry out the above methods.

In another aspect, the invention may be directed to an apparatus for manufacturing integrated circuits. The apparatus includes a substrate transfer station for transporting a substrate into or out of the apparatus, a processing station having a processing station center point, a robotic arm having a blade for attaching a substrate thereon, an arm position sensor to measure a position of the robotic arm, an edge detector, and a controller. The controller is configured to store a default position for the edge detector, move the blade based on the default position of the edge detector such that at least three edge points on the blade pass through and are detected by the edge detector, store an arm position measurement from the arm position sensor at each position of the robotic arm at which an edge point of the blade is detected by the edge detector, and determine at least one of an actual position of the edge detector and an offset for measurements of the arm position sensor based on the plurality of arm position measurements.

Implementations of any of the inventions may include one or more of the following features. The actual position of the edge detector may be determined based on the plurality of arm position measurements. The offset for measurements of the arm position sensor may be determined based on the plurality of arm position measurements. Both the actual position of the edge detector and the offset for measurements of the arm position sensor may be determined based on the plurality of arm position measurements.

The blade may be circular. The substrate may be circular. The station may be a substrate transfer station for transporting substrate into or out of the microelectronic manufacturing apparatus, or the station may be a processing station. The edge detector may include a photo transmitter to generate a light beam and a photo detector. A light beam generated by the photo transmitter may be parallel to a rotating axis of the robotic arm. The blade for attaching the wafer thereon may have a vacuum attaching system. The controller may be configured to monitor a pressure in the vacuum attaching system to detect whether the wafer is attached to the blade.

A position of a center of the blade may be calculated from the plurality of arm position measurements. The at least one of the actual position of the edge detector and the offset for measurements of the arm position sensor may be based on the diameter of the blade. Detecting the at least three edge points may include passing the blade across a light beam while changing the position of the robotic arm. Measuring an arm position may includes measuring radial position and an angular position of the robotic arm.

A default position may be stored for a station, a substrate may be picked up from the station with the blade of the robotic arm based on the default position of the station, the blade on the robotic arm may be moved such that at least three edge points on the substrate pass through and are detected by the edge detector, a second plurality of arm position measurements may be generated from the arm position sensor by measuring a position with the arm position sensor of the robotic arm at each position of the robotic arm at which an edge point of the substrate is detected by the edge detector, and an actual position of the station may be determined based on a the second plurality of arm position measurements. Determining an actual position of the station may include calculating a position of a center of the substrate from the second plurality of arm position measurements. A substrate may be retrieved from a substrate transfer station and delivered to the processing station before retrieving the substrate from the processing station. The processing station may be an electroplating station.

A vertical position of the station may be determined. A blade may be moved along a vertical axis toward the station and measuring a vertical position of the robotic arm when a pressure in a vacuum attaching system on the blade changes.

Aspects of the invention can include one or more of the following advantages. The system can automatically determine the position of a processing cell and calibrate the position of a robotic arm. An apparatus can be calibrated faster, cheaper, and more conveniently than manual calibration. The likelihood of damage to the substrate due to misalignment during movement of a substrate can be reduced. Other advantages will be apparent from the attached figures and the description below.

BRIEF DESCRIPTION OF THE DRAWINGS

FIG. 1 is a perspective view of an apparatus for positioning a substrate at a destination position in a cell.

FIG. 2a is a top view of a blade (in phantom) with a wafer attached.

FIG. 2b is a side view of a blade with a wafer attached.

FIG. 2c is a schematic top view illustrating radial and angular coordinates of the blade (in phantom) and the wafer.

FIG. 3a shows a top view of a transfer station.

FIG. 3b shows a side view of a transfer station.

FIG. 4a shows a top view of a wafer cell.

FIG. 4b shows a side view of a wafer cell.

FIG. 5 is a flow chart illustrating a method of automatically calibrating positions of elements of a substrate processing station.

FIG. 6 illustrates initial entries in a data table storing radial, angular and vertical positions of elements of a substrate processing station.

FIGS. 7a-7c are side views of the edge detection sensor illustrating a process of calibrating a spinning angle of a blade.

FIG. 8 is a flow chart illustrating a method of calibrating the radial and angular position of the blade and calculating the radial and angular position of the edge detector.

FIG. 9a is a top view showing a blade positioned near an edge detector.

FIGS. 9b-9d are top views showing the edge detector measuring a point on an edge of a blade.

FIG. 10 illustrates updated entries in the data table.

FIG. 11 is a flow chart illustrating a method of calculating the corrected center position of the transfer station.

FIGS. 12a and 12b show a relationship between a blade center point and a wafer center point.

FIGS. 13a-13c are top views showing the edge detector measuring a point on an edge of a wafer.

FIG. 14 shows a relationship between a blade center point and a wafer center point when the edge detector is measuring a point on an edge of a wafer.

FIG. 15 illustrates updated entries in the data table.

FIG. 16 is a flow chart illustrating a method of calculating the corrected center position of the cell.

FIG. 17 illustrates updated entries in the data table.

FIG. 18 is a top view of an integrated electrochemical plating (ECP) apparatus.

DETAILED DESCRIPTION OF THE INVENTION

FIG. 1 shows a simplified substrate processing apparatus 100 that can position a substrate 10 at a destination position in a cell 140. The apparatus 100 includes a support structure 110 that supports a robotic arm 120, a substrate loading station 160 for transferring the substrate into or out of the apparatus 100 from some other system subassembly, such as a factory interface unit, a cell 140 for processing the substrate 10, and an edge detector 150. The cell 140, the edge detector 150 and the substrate loading station 160 are substantially fixed with respect to a support structure 110 at least during some time period, e.g., except during manufacturing or repair procedures.

The robotic arm 120 can rotate around a vertical axis 124, and both the length and the height of the robotic arm 120 can be changed. A blade 130 is located at the end of the robotic arm 120. The blade 130 can spin along a radius axis 121 of the robotic arm 120. In one implementation, the blade 130 is substantially circular in shape.

The frame of reference of the support structure 110 defines a fixed coordinate system. In an exemplary fixed coordinate system, positions of interest in the apparatus are defined by r-coordinates, θ-coordinates and z-coordinates, where the r-coordinate is defined by a distance from the vertical axis 124, the θ-coordinate is defined by an angular distance from a common arbitrary plane passing through the vertical axis 124, and the z-coordinate is defined by a distance from a common arbitrary horizontal plane, such as the top of the support structure 110.

The center of the blade 130 defines a blade center point 135. The angular rotation of the robotic arm 120 sets the angular position $\theta_b$ of the blade center point 135. The length of the robotic arm 120 sets the radial position $r_b$ of the blade center point 135. The height of the robotic arm 120 sets the vertical position $z_b$ of the blade center point 135. In addition, the angular position of the blade 130 about the radial axis 121 defines a spinning angle χ.

The robotic arm 120 is generally controlled by a robotic controller. The robotic controller can be a computer 190 having a storage medium, such as a hard disk drive. Computer programs for controlling the robotic arm 120 can be stored on the storage medium.

The position of the robot arm 120 may be sensed, e.g., by encoders coupled to the drive motors of the arm 120, to generate a signal indicating the current position $r_b$, $\theta_b$, $z_b$, χ of the blade 130.

Referring to FIGS. 1 and 2a-2c, the substrate 10 can be attached to the blade 130. For example, the wafer 10 can be attached to the blade 130 with a vacuum chuck. The substrate 100 has a substrate center point 15. When the substrate is being held by the blade 130, the position of the substrate center point 15 defines the r-coordinate, θ-coordinate, and z-coordinate, $r_w$, $\theta_w$, and $z_w$, respectively, of the substrate. In one implementation, the substrate is a wafer, e.g., a generally round disk, possibly with a notch or flat. Typical diameters for the wafer are 200 mm and 300 mm. FIG. 2a shows a top view of the blade 130 with the wafer 10 attached. FIG. 2b shows a side view of the blade 130 with the wafer 10 attached. FIG. 2c illustrates the coordinates of the wafer when the center point 15 of the wafer and the center point 135 of the blade 130 are not vertically aligned.

Returning to FIG. 1, the robotic arm 120 can retrieve a wafer 10 from or deliver a wafer 10 to the transfer station 160. The transfer station 160 has a transfer station target point 165 which is the desired location for the center point 15 of the wafer. The r-coordinate, the θ-coordinate, and the z-coordinate of the transfer station target point 165 are $r_t$, $\theta_t$, and $z_t$, respectively.

In one implementation, as shown in FIGS. 3a and 3b, the transfer station 160 includes a circular edge support ring 162 with a support lip 164 to support the edge of the wafer 10. The wafer 10 is held in position by the lip 164. The edge support ring 162 may include a sloped section 166 so that when the wafer is deposited in the transfer station, the wafer automatically slides into a centered position on the ring 162. The ring 162 can be secured to the supporting structure 110 by supporting legs 168. Many other implementations of the transfer station 160 are also possible. For example, the transfer station 160 could include lift pins or centering arms.

Returning to FIG. 1, the robotic arm 120 can place a wafer in or pick a wafer from the cell 140. An exemplary cell can be an electroplating cell (and the apparatus 100 can be an ECP apparatus), although many other types of cells are possible, such as cleaning cells, polishing cells, thermal processing cells, and chemical or plasma vapor deposition cells. The specific operation of the cells will not be discussed at length, as it will be implemented according to the specific design requirements of the microelectronic manufacturing apparatus.

The cell 140 has a cell center point 145 which is the desired location for the center point 15 of the wafer. The r-coordinate, the θ-coordinate, and the z-coordinate of the cell center point 145 are $r_c$, $\theta_c$, and $z_c$, respectively. The robotic arm 120 generally can also place the wafer 10 on other wafer cells or pick up another wafer 20 from other wafer cells.

It should be noted that the transfer station 160 may itself be a cell; the transfer station differs in that it may be the first cell from which the wafer is retrieved by the robotic arm 120 during standard microelectronics manufacturing procedures.

In one implementation, as shown in FIGS. 4a and 4b, the cell 140 includes a circular edge support ring 142 with a support lip 144 to support the edge of the wafer 10. The wafer 10 is held in position by the lip 144. The edge support ring 142 may include a sloped section 146 so that when the wafer is deposited in the cell, the wafer automatically slides into a centered position on the ring 162. The cell 140 can be secured to the supporting structure 110 by support legs 148. Other implementations of the cell 140 are also possible.

Finally, the edge detector 150 includes a photo transmitter 152 and a photo detector 154. The photo transmitter 152 transmits a light beam 156 to the photo detector 154. The light beam 156 is oriented along a substantially vertical axis. If an object is not completely transparent, the edge of the object can be detected by the edge detector 150 when the object moves across the light beam 156. The r-coordinate and the θ-coordinate of the light beam 156 are $r_s$ and $\theta_s$, respectively.

As discussed above, in operation the robot arm 120 picks a wafer from the transfer station 160 and delivers the wafer to the cell 140. After processing, the robot arm 120 will retrieve the wafer and move it the same transfer station or a different transfer station. Of course, the wafer can undergo processing at multiple cells before being moved to the transfer station.

As mentioned above, the computer control system 190 controls the positioning of the robot arm 120 when picking or depositing the wafer. In general, the computer control system 190 stores desired target positions of the wafer at the various elements of the apparatus, e.g., the r, θ and z positions of the transfer station 160 and the cell 140. It is important that these values be accurate, as incorrect positioning of the wafer may result in undesired contact of the wafer against the apparatus, resulting in wafer damage. Unfortunately, after assembly of the apparatus, the actual positions of the elements may not precisely match the desired positions, due to part tolerances, manufacturer error, or the like. Consequently, the values initially stored in the computer 190 may not be accurate. In addition, the signal indicating the current position of the blade 130 may not accurately represent the actual position of the blade 130, as the sensor mechanism may need to be calibrated. Although it is possible to manually calibrate the signal from the blade position sensor and to manually set the target positions stored in the computer, e.g., by manually measuring the positions of the parts of the apparatus, this is a time-consuming and cumbersome operation. In contrast, the method performed by the computer control system 190 as set forth below can be performed automatically, and can significantly reduce the time required to set-up the apparatus and the danger of damage to the wafer.

Using the method shown in FIG. 5, default positions for the cell 140, the edge sensor 150 and the transfer station 160 can be replaced by accurate positions, and the blade position measurements can be calibrated. In particular, assuming that the radius of the blade 130 and the radius of the wafer 10 are accurately known, the coordinates of the cell center point 145, the coordinates of the blade center point 135, the coordinates of the light beam 156, and the coordinates of the transfer station target point 165, can all be determined using the edge detector 150, as described below.

Referring to FIGS. 5 and 6, initially, the computer is loaded with default rough positions for the elements of the system (step 202). FIG. 6 shows the entries in a data table 192 before the exact positions are determined. The rough table lists the default position for the transfer station 160, the cell 140 and the edge sensor 150. The default position for the cell 140 is specified by the default rotating angle $\theta'_c$, the default radius distance $r'_c$, and the default vertical distance $z'_c$. The default position for the transfer station is specified by the default rotating angle $\theta'_t$, the default radius distance $r'_t$, and the default vertical distance $z'_t$. The default position for the edge detector is specified by the default rotating angle $\theta'_s$, the default radius distance $r'_s$, and the default vertical distance $z'_s$. These default positions can be based on manufacturing specifications.

Next, the sensor signal that indicates the spinning angle χ is calibrated (step 204). In particular, for later calibration of the signals indicating the radial and angular position, $r_b$, $\theta_b$, of the blade, and for later positioning of the wafer, the blade surface should be set parallel to the x-y plane.

In one implementation, as shown in FIG. 7a-7c, the spinning angle χ of the blade 130 on the robotic arm 120 is set to a first spinning angle $\chi_1$. Using the default positions stored in the computer, the robot arm swings the blade 130 toward the light beam 156 while keeping the radial position of the blade constant. When the robotic arm 120 reaches a certain critical position (as shown in FIG. 7b), the light beam 156 will be blocked by the blade 130. The robotic arm 120 then keeps the blade at the same radial and angular position, while spinning the blade 130 in a direction shown by arrow A that should make the light beam 156 unblocked by the blade 130. As the blade 130 continues to spin in the direction A, it eventually reaches a second spinning angle $\chi_2$, at which the light beam 156 is again blocked by the blade 130. The average of the first spinning angle $c_1$ and the second spinning angle $\chi_2$, $\chi_{av}=(\chi_1+\chi_2)/2$, is the spinning angle at which the blade surface is perpendicular to the x-y plane.

In another implementation, the robotic arm 120 is kept at a position near the light beam 156 such that the light beam 156 can be alternately blocked and unblocked by the blade 130 as the blade 130 spins around the axis 121. The spinning angle at which the blade surface is perpendicular to the x-y plane can be determined by the average of a first spinning angle $\chi_1$ and a second spinning angle $\chi_2$, $\chi_{av}=(\chi_1+\chi_2)/2$ at which the light beam becomes unblocked.

In another implementation, when the blade 130 on the robotic arm 120 is swung across the light beam 156, the light beam 156 will be blocked by the blade 130 during some time period ΔT. When the robotic arm 120 swings across the light beam 156 with a constant angle speed, the time period ΔT is minimized when the blade surface 138 is perpendicular to the x-y plane. Therefore, the spinning angle χ can be calibrated by determining a spinning angle at which the time period ΔT is minimized. For example, blade can be passed multiple times through the light beam 156, each time incrementing or decrementing the spin angle based on the whether the time period ΔT had increased or decreased and by successively smaller amounts, until the time period reaches an equilibrium.

After the spinning angle χ is calibrated, the wafer surface or the blade surface can be set parallel to the x-y plane by rotating the blade through a right angle. The processes described above may also work if the wafer 10 is attached to the blade 130.

Once the blade 130 has been oriented horizontally, the sensor signals that indicate the current blade radial and angular position of the blade 130, $r_b$, $\theta_b$, are calibrated (step 206), and the radial and angular position of the light beam 154, $r_s$, $\theta_s$, are calculated (step 208). The ordering of steps 206 and 208 is not particularly important, and they can be considered to be performed simultaneously.

In general, prior to calibration, the measured radial and angular position of the blade 130 (as represented by the uncalibrated sensor signals) differs from the actual position of the blade 130 by a constant amount. Thus, the actual position of the blade $r_b$, $\theta_b$, can be calculated from the following equations:

$$r_b = r_m + \Delta r \quad \text{[Eq. 1]}$$

$$\theta_b = \theta_m + \Delta\theta \quad \text{[Eq. 2]}$$

where $r_m$ and $\theta_m$ are the measured radial and angular position of the blade 130, and Δr and Δθ are offset parameters to be calculated as described below.

Referring to FIGS. 8 and 9a, initially the wafer 10 is rotated into a horizontal position (step 242) and, based on the default positions stored in the computer, moved into position near the light beam 156 (step 244). The distance D between the blade center point 315 and the light beam 156 can generally described by equation:

$$D = [(r_b)^2 + (r_s)^2 - 2(r_b \cdot r_s)\cos(\theta_b - \theta_s)]^{1/2} \quad \text{[Eq. 3]}$$

where $r_b$ is the radial position of the blade, $\theta_b$ is the angular position of the blade, $r_s$ is the radial position of the sensor, and $\theta_s$ is the angular position of the sensor.

Referring to FIG. 9b, the robot arm 120 then moves the blade 130 until the edge of the blade interrupts the light beam (step 246). In this first position, the rotating angle θ and the radius distance r of the robotic arm 120 are respectively equal to $r_{b1}$ and $\theta_{b1}$, respectively, and the blade position sensor generates positions signals $r_{m1}$ and $\theta_{m1}$. In this position, the coordinates of the blade 130 and the light beam 154 satisfy the following equation:

$$R_B = [(r_{b1})^2 + (r_s)^2 - 2(r_{b1} \cdot r_s)\cos(\theta_{b1} - \theta_s)]^{1/2} \quad \text{[Eq. 4]}$$

where $R_B$ is the radius of the circular blade 130.

Referring to FIG. 9c, the robot arm 120 then swings the blade 130 from its initial position (shown in phantom) in an angular direction (shown by arrow A) (step 248). The length of the robot arm 120 does not change, thus maintaining the same radial position of the blade 130. Initially, the blade 130 will block the light beam 154. Eventually, however, the light beam will traverse the blade, and the light beam will be unblocked. In this second position, the rotating angle θ and the radius distance r of the robotic arm 120 are respectively equal to $r_{b1}$ and $\theta_{b2}$, respectively, and the blade position sensor generates positions signals $r_{m1}$ and $\theta_{m2}$. In this position, the coordinates of the blade 130 and the light beam 154 satisfy the following equation:

$$R_B = [(r_{b1})^2 + (r_s)^2 - 2(r_{b1} \cdot r_s)\cos(\theta_{b2} - \theta_s)]^{1/2} \quad \text{[Eq. 5]}$$

Referring to FIG. 9d, the robot arm 120 then extends the blade 130 from its previous position (shown in phantom) along a radial direction (shown by arrow B) (step 250). The angular position of the robot arm 120 does not change, thus maintaining the same angular position of the blade 130. Initially, the blade 130 will again block the light beam 154. Eventually, however, the light beam will traverse the blade, and the light beam will be unblocked. In this third position, the rotating angle θ and the radius distance r of the robotic arm 120 are respectively equal to $r_{b2}$ and $\theta_{b2}$, respectively, and the blade position sensor generates positions signals $r_{m2}$ and $\theta_{m2}$. In this position, the coordinates of the blade 130 and the light beam 154 satisfy the following equation:

$$R_B = [(r_{b2})^2 + (r_s)^2 - 2(r_{b2} \cdot r_s)\cos(\theta_{b2} - \theta_s)]^{1/2} \quad \text{[Eq. 6]}$$

Based on the known blade radius $R_B$, and the measured coordinates signals $r_{m1}$, $r_{m2}$, $\theta_{m1}$ and $\theta_{m2}$, the radial and angular position of the sensor, $r_s$ and $\theta_s$, and the sensor offset parameters Δr and Δθ are calculated (step 252). Specifically, these four unknowns can be calculated by solving the following four equations:

$$R_B = [(r_{m1} + \Delta r)^2 + (r_s)^2 - 2((r_{m1} + \Delta r) \cdot r_s)\cos((\theta_s - \theta_{m1} - \Delta\theta)]^{1/2} \quad \text{[Eq. 7]}$$

$$\frac{r_{m2} + r_{m1}}{2} + \Delta r = r_s \cos(\theta_{m2} + \Delta\theta - \theta_s) \quad \text{[Eq. 8]}$$

$$\frac{r_{m2} - r_{m1}}{2} = [R_B^2 + (r_s \cos(\theta_{m2} + \Delta\theta - \theta_s))^2]^{1/2} \quad \text{[Eq. 9]}$$

$$\frac{\theta_{m1} + \theta_{m2}}{2} = \theta_s - \Delta\theta \quad \text{[Eq. 10]}$$

Referring to FIG. 10, the data table 192 can be updated with the values $r_s$, $\theta_s$, Δr and Δθ (step 256). Thus, future blade position sensor measurement need merely add the offset parameters Δr and Δθ to provide accurate measurements of the blade position.

Once the sensed blade position, $r_b$, $\theta_b$, has been calibrated, and the radial and angular position of the light beam 154, $r_s$, $\theta_s$, have been calculated, the system can determine the target point 165 of the transfer station 160 (step 212).

Referring to FIG. 11, calibration of transfer station target point 165 begins with moving the blade 130 to the default transfer station position $r'_t$, $\theta'_t$ (step 262). The blade 130 is then lowered along the z-axis into contact with the wafer (step 264). The vertical position of the robot arm 120 is measured at the instant that the wafer 10 attaches to the blade 130 (step 266), and this vertical position is then used as the actual vertical position $z_t$ of the transfer station target point. The instant that the wafer 10 is attached to the blade 130 can be determined by variety of known methods, such as by monitoring the vacuum pressure in the vacuum attaching system. The data table 192 can be updated with the vertical position $z_t$ (step 270), although this step could be performed later.

As discussed above, the transfer station target point 165 may not precisely match the default position. Consequently, when the wafer 10 is chucked to the blade 130, the wafer center point 15 will not be precisely aligned with the blade center point 135. However, by using the edge detector 150 it is possible to determine a radial and angular difference, δr and δθ, between the wafer center point and the blade center point, and use these difference to determine the actual position, $r_t$ and $θ_t$, of the transfer station target point.

Referring to FIGS. 12a and 12b, in general, the relationship of radial and angular difference, δr and δθ, to the blade position (δr is equal to $r_b-r_w$, where $r_w$ is the radial position of the center point of the wafer, and δθ is equal to $θ_b-θ_w$, where $θ_w$ is the angular position of the center of the wafer) is given by the following equations:

$$δr=[(r_b+a_t)^2+b_t^2]^{1/2}-r_b \quad \text{[Eq. 11]}$$

$$δθ = \arctan\left(\frac{b_t}{r_b + a_t}\right) \quad \text{[Eq. 12]}$$

where $a_t$ and $b_t$ are correction parameters that can be calculated as discussed below.

As shown in FIG. 13a-13c, the robotic arm 120 moves the wafer so that the edge detector measures the coordinates of three points on the edge of the wafer 10 (steps 272-276). FIG. 13a shows the light beam 156 crossing the wafer edge when the robotic arm 120 is in a first position. In this first position, the position of the blade center point 135 is $r_{b1t}$ and $θ_{b1t}$, and the position of the wafer center point is $r_{w1t}$ and $θ_{w1t}$. FIG. 13b shows the light beam 156 crossing the wafer edge when the robotic arm 120 is in a second position. In this second position, the position of the blade center point 135 is $r_{b2t}$ and $θ_{b2t}$, and the position of the wafer center point is $r_{w2t}$ and $θ_{w2t}$. FIG. 13c shows the light beam 156 crossing the wafer edge when the robotic arm 120 is in a first position. In this first position, the position of the blade center point 135 is $r_{b3t}$ and $θ_{b3t}$, and the position of the wafer center point is $r_{w3t}$ and $θ_{w3t}$.

Using the known parameters is $r_{b1t}$, $θ_{b1t}$, $r_{b2t}$, $θ_{b2t}$, $r_{b3t}$, $θ_{b3t}$ and $R_W$, the actual wafer center point can be calculated for one of the positions, e.g., $r_{w1t}$, $θ_{w1t}$ using known techniques (step 278). Then sample offset parameters, $δr_{1t}$ and $δθ_{1t}$, for the selected position can be calculated from the wafer center point $r_{w1t}$, $θ_{w1t}$ and blade center point $r_{b1t}$, $θ_{b1t}$ ($δr_{1t}=r_{b1t}-r_{w1t}$, $δθ_{1t}=θ_{b1t}-θ_{w1t}$), the correction parameters $a_t$ and $b_t$ can also be calculated based on equations 11 and 12.

In another implementation, if the system moves the wafer first by swinging through an arc without changing the radial position of the arm, and then extending the arm without changing the angular position of the arm, the calculation of the sample correction parameters can be significantly simplified, and requires only two steps.

Referring to FIG. 14, the light beam 156 crosses the wafer edge when the robotic arm 120 is in a first position and when the robotic arm is in a second position. In the first position, the position of the blade center point 135 is $r_{b1t}$ and $θ_{b1t}$, and the position of the wafer center point is $r_{w1t}$ and $θ_{w1t}$. In the second position, the position of the blade center point 135 is $r_{b1t}$ and $θ_{b2t}$, and the position of the wafer center point is $r_{w2t}$ and $θ_{w2t}$. Thus, the correction parameters $a_t$ and $b_t$ can be calculated by solving the following equations:

$$R_W^2 = (r_{b1t} + a_t)^2 + b_t^2 + r_s^2 - 2((r_{b1t} + a_t)r_s)\cos\left(θ_s - θ_{b1t} - \arctan\frac{b_t}{r_{b1t}+a_{tt}}\right) \quad \text{[Eq. 13]}$$

$$\arctan\left(\frac{b_t}{r_{b1t}+a_t}\right) = θ_s - \frac{θ_{b1t} + θ_{b2t}}{2} \quad \text{[Eq. 14]}$$

Once the sample correction parameters are known, the corrected values for the transfer station target position 165 can be calculated (step 280) as follows:

$$r_t=[(r'_t+b_t)^2+a_t^2]^{1/2} \quad \text{[Eq. 15]}$$

$$θ_t = θ'_t + \arctan\left(\frac{a_t}{r'_t + b_t}\right) \quad \text{[Eq. 16]}$$

Next, as shown in FIG. 15, the data table 192 stored in the computer can be updated with the corrected position values of the transfer station 160 (step 282). Consequently, when wafers are lifted from the transfer station in later operations, the center point of the wafer and the center point of the blade can be precisely aligned.

Once the sensed blade position, $r_b$, $θ_b$, has been calibrated, and the radial and angular position of the light beam 154, $r_b$, $θ_s$, have been calculated, the system can determine the center point 145 of the cell 160 (step 214). Step 214 may be performed before or after step 212, although calculations are simpler if the step 214 is performed after step 212.

FIG. 16 shows a method 214 for finding the coordinates of the cell center point 145 in the wafer cell 140. Initially, the wafer 10 is removed from the wafer transfer station 160 (step 302). Assuming that the transfer station target point has previously been calibrated, the center of the wafer will be aligned with the center of the blade. The robot arm moves the wafer to the default position, $r'_c$, $θ'_c$, over the cell 140 (step 304), and lowers and releases the wafer into the cell 140 (step 306). While in the cell, the position of the wafer 10 is adjusted so that the wafer center point 15 matches the cell center point 145 (step 308). This step need not be active and can be considered optional; for example, the wafer may slide on a sloped section 146 of the cell and naturally slide into a centered position. Alternatively, the cell may include a centering mechanism, such as a set of arms that actuate radially inwardly.

The blade 130 is then lowered along the z-axis into contact with the wafer while the arm is positioned at the default position (step 310). The vertical position of the robot arm 120 is measured at the instant that the wafer 10 attaches to the blade 130 (step 312), and this vertical position is then used as the actual vertical position $z_c$ of the cell target point. The instant that the wafer 10 is attached to the blade 130 can be determined by variety of known methods, such as by monitoring the vacuum pressure in the vacuum attaching system. The data table 192 can be updated with the vertical position $z_t$ (step 314), although this step could be performed later.

As mentioned above, the wafer is picked up by the robotic arm 120 from the cell when the blade is at the default position. Since the center point of the cell does not exactly match the default position, the wafer center point 15 will not be precisely aligned with the blade center point 135. Consequently, there will be an offset between the blade center and the wafer center, as discussed above with respect to the transfer station. However, by using the edge detector 150 it is possible to determine a radial and angular difference, δr and δθ, between the wafer center point and the blade center point, and use these difference to determine the actual position, $r_c$ and $θ_c$, of the cell target point. Specifically, the positions of the blade are measured when the light beam contacts the several points at the edge of the wafer, and these positions and the wafer radius are used to calculate the actual position, $r_c$ and $θ_c$, of the cell target point. Since these calculations are substantially the same as those discussed with respect to the transfer station, they will not be discussed in detail.

However, a procedure similar to that described above with respect to the transfer station can be used. In particular, the computer can first move the arm until the edge of the wafer intersects the edge detector, and can store the blade position measurements (step 320). In the first position, the position of the blade center point 135 is $r_{b1c}$ and $\theta_{b1c}$, and the position of the wafer center point is $r_{w1c}$ and $\theta_{w1c}$. The system can then move the wafer swinging through an arc without changing the radial position of the arm until the blade reaches a position where the wafer no longer blocks the edge detector, and can again store the blade position measurement (step 322). In the second position, the position of the blade center point 135 is $r_{b1c}$ and $\theta_{b2c}$, and the position of the wafer center point is $r_{w2c}$ and $\theta_{w2c}$. Thus, correction parameters $a_c$ and $b_c$ for the cell can be calculated (step 324) by solving the following equations:

$$R_W^2 = (r_{blc} + a_c)^2 + b_s^2 + r_s^2 - 2((r_{blc} + a_c) \cdot r_s) \cos \quad \text{[Eq. 17]}$$
$$\left(\theta_s - \theta_{blc} - \arctan\frac{b_c}{r_{blc} + a_c}\right)$$

$$\arctan\left(\frac{b_c}{r_{blc} + a_t}\right) = \theta_s - \frac{\theta_{blc} + \theta_{b2c}}{2} \quad \text{[Eq. 18]}$$

where $R_W$ is the wafer diameter.

Once the sample correction parameters are known, the corrected values for the cell target position 145 can be calculated (step 326) as follows:

$$r_c = [(r'_c + b_c)^2 + a_c^2]^{1/2} \quad \text{[Eq. 19]}$$

$$\theta_c = \theta'_c + \arctan\left(\frac{a_c}{r'_c + b_c}\right) \quad \text{[Eq. 20]}$$

Once the actual position of the cell target point is determined, the data table 192 (see FIG. 17) stored in the computer can be updated with the corrected position values (step 328). Once the coordinates of the cell center point 145 are known, the robotic arm 120 generally can place the wafer 10 on the wafer cell 140 such that the wafer center point 15 of the wafer 10 nearly matches the cell center point 145.

Naturally, if the system includes multiple transfer stations or multiple cells, the position calculation procedure can repeated for each station or cell.

In general, a wafer center point in a wafer can be determined by measuring more than three edge points on the wafer, and a blade center point in a blade can be determined by measuring more than three edge points on the blade. In one implementation, the edge points on the wafer need to be measured when the normal vector of the wafer surface is parallel to the rotating axis of the robotic arm; the edge points on the blade need to be measured when the normal vector of the blade surface is parallel to the rotating axis of the robotic arm. That is, for this implementation, the wafer surface or the blade surface needs to be parallel to the x-y plane, as shown in FIG. 1.

In general, if offset parameters of a blade center on a blade are known, a wafer can be moved between wafer cells by a robotic arm such that the blade center is co-centric with the wafer center. The coordinates of a cell center point of each of the wafer cells can be determined, and the robotic arm generally is able to place the wafer on each of the wafer cells such that the wafer center point matches the cell center point. In fact, if offset parameters of a blade center on a blade are not known or a blade is not substantially circular in shape, the coordinates of a cell center point of each of the wafer cells can still be determined, and the robotic arm generally is still able to place the wafer on a wafer cell such that the wafer center point matches the cell center point of each of the wafer cells.

In the above, apparatus for measuring cell positions and for positioning wafers in a destination cell is disclosed. Methods for measuring cell positions and methods for positioning wafers in a destination cell are also disclosed. These apparatus and methods can be applied to microelectronic manufacturing processes and equipments, such as ECP processes and equipments.

ECP is a microelectronic manufacturing process for depositing copper films on a wafer using electro-chemical plating process. Before starting the ECP process, a layer of barrier seed is deposited on the wafer, for example, using physical vapor deposition ("PVD") or chemical vapor deposition ("CVD") techniques. The wafer with the layer of barrier seed is placed in a wafer cell and immersed into electrochemical solutions. When an electric voltage is applied between a copper electrode and the layer of barrier seed, layers of copper atoms will be deposited on the wafer.

FIG. 18 shows an integrated electrochemical plating ("ECP") apparatus 1100. The ECP equipment 1100 includes a wafer loader and a mainframe. The wafer loader includes dual robotic arms 1220a and 1220b, cassettes 1240a and 1240b, anneal chambers 1260a and 1260b, and an aligner 1230. The mainframe includes Spin-Rinse-Dry ("SRD") cells 1170a and 1170b, ECP cells 1140a and 1140b, ECP cells 1160a and 1160b, and Integrated Bevel Clean ("IBC") cells 1180a and 1180b. The mainframe also includes robotic arms 120a and 120b of a dual-handed robot.

In the wafer loader, the robotic arm 1220a can move wafers between a number of places that include the cassette 1240a, the anneal chamber 1260a, the aligner 1230 and the SRD cell 1170a. An edge detector can be used to enable the robotic arm 1220a to position wafers precisely in these different places. The robotic arm 1220b can move wafers between a number of places that include the cassette 1240b, the anneal chamber 1260b, the aligner 1230 and the SRD cell 1170b. An edge detector can be used to enable the robotic arm 1220b to position wafers precisely in these different places.

In the mainframe, the robotic arms 120a can move wafers between a number of places that include the SRD cell 1170a, the ECP cell 1140a, the ECP cell 1160a, and the IBC cell 1180a. An edge detector can be used to enable the robotic arm 120a to position wafers precisely in these different places. The robotic arms 120b can move wafers between a number of places that include the SRD cell 1170b, the ECP cell 1140b, the ECP cell 1160b, and the IBC cell 1180b. An edge detector can be used to enable the robotic arm 120b to position wafers precisely in these different places.

In one implementation, as shown in FIG. 18, an edge detector 150 is installed on the mainframe. A light beam 156 for the edge detector 150 is also shown in the figure. Both the robotic arms 120a and 120b use the edge detector 150 for positioning wafers precisely in different places. In an alternative implementation, two edge detectors can be used: one for the robotic arm 120a and one for the robotic arm 120b.

As an example, using the edge detector 150, the robotic arm 120a can position a wafer in the SRD cell 1170a, the ECP cell 1140a, the ECP cell 1160a, or the IBC cell 1180a such that the wafer center point matches the cell center point of the corresponding wafer cells. In one implementation, the position of the edge sensor 150 and the sensor offsets are determined using the method shown in FIG. 8. Then target position of any transfer station is determined using the method shown in FIG. 11. Finally, the cell center points of the SRD cell 1170a, the ECP cell 1140a, the ECP cell 1160a, and the IBC cell 1180a are measured using the method shown in FIG. 15. The wafer can then be moved between these cells such that the wafer center is co-centric with the blade center of a blade on the robotic arm 120a.

A method and system has been disclosed for positioning wafers during microelectronic manufacturing processes. Although the present invention has been described in accordance with the implementations shown, one of ordinary skill in the art will readily recognize that there could be variations to the implementations and those variations would be within the spirit and scope of the present invention.

In the above, the position of a robotic arm is generally specified by a rotating angle θ, a radius distance r, and a vertical distance z. In general, the position of a robotic arm can also be specified by other types of coordinate variables.

Similarly, other types of offset parameters can also be used for specifying the position of a blade center point. These types of offset parameters for specifying the position of a blade center point can also be determined by measuring more than three blade edge points.

In addition, a wafer cell is a generic term describing a structure for placing a wafer. The wafer can be placed in a wafer cell with face up, face down, or in some other direction. Examples of the wafer cell include a plating cell and an IBC module.

Accordingly, many modifications may be made by one of ordinary skill in the art without departing from the spirit and scope of the appended claims.

What is claimed is:

1. A method for calibrating a controller of a robotic arm in a microelectronics manufacturing apparatus, comprising:
   storing a default position for an edge detector;
   moving a blade on the robotic arm based on the default position of the edge detector such that at least three edge points on the blade pass through and are detected by the edge detector;
   generating a plurality of arm position measurements from an arm position sensor by measuring a position with the arm position sensor of the robotic arm at each position of the robotic arm at which an edge point of the blade is detected by the edge detector; and
   determining at least one of an actual position of the edge detector and an offset for measurements of the arm position sensor based on the plurality of arm position measurements.

2. The method of claim 1, wherein the actual position of the edge detector is determined based on the plurality of arm position measurements.

3. The method of claim 1, wherein the offset for measurements of the arm position sensor is determined based on the plurality of arm position measurements.

4. The method of claim 1, wherein both the actual position of the edge detector and the offset for measurements of the arm position sensor are determined based on the plurality of arm position measurements.

5. The method of claim 1, wherein the determining step includes calculating a position of a center of the blade from the plurality of arm position measurements.

6. The method of claim 1, wherein the blade is circular.

7. The method of claim 6, wherein the at least one of the actual position of the edge detector and the offset for measurements of the arm position sensor are based on the diameter of the blade.

8. The method of claim 1, wherein the step of generating a plurality of measurements includes detecting the at least three edge points on the blade with the edge detector.

9. The method of claim 8, wherein detecting the at least three edge points includes passing the blade across a light beam while changing the position of the robotic arm.

10. The method of claim 9, wherein the edge detector includes a photo transmitter and a photo detector.

11. The method of claim 1, wherein measuring an arm position includes measuring radial position and an angular position of the robotic arm.

12. The method of claim 1, further comprising:
    storing a default position for a station;
    picking up a substrate from the station with the blade of the robotic arm based on the default position of the station;
    moving the blade on the robotic arm such that at least three edge points on the substrate pass through and are detected by the edge detector;
    generating a second plurality of arm position measurements from the arm position sensor by measuring a position with the arm position sensor of the robotic arm at each position of the robotic arm at which an edge point of the substrate is detected by the edge detector; and
    determining an actual position of the station based on a the second plurality of arm position measurements.

13. The method of claim 12, wherein determining an actual position of the station includes calculating a position of a center of the substrate from the second plurality of arm position measurements.

14. The method of claim 12, wherein the substrate is circular.

15. The method of claim 12, wherein the station comprises a substrate transfer station for transporting substrate into or out of the microelectronic manufacturing apparatus.

16. The method of claim 12, wherein the station comprises a processing station.

17. The method of claim 16, further comprising retrieving the substrate from a substrate transfer station and delivering the substrate to the processing station before retrieving the substrate from the processing station.

18. The method of claim 16, wherein the processing station comprises an electroplating station.

19. The method of claim 12, further comprising determining a vertical position of the station.

20. The method of claim 19, wherein determining the vertical position includes moving a blade along a vertical axis toward the station and measuring a vertical position of the robotic arm when a pressure in a vacuum attaching system on the blade changes.

21. A method for calibrating a controller of a robotic arm in a microelectronics manufacturing apparatus, comprising:
    storing a default position for a station;
    picking up a substrate from the station with the blade of the robotic arm based on the default position of the station;
    moving the blade on the robotic arm such that at least three edge points on the substrate pass through and are detected by an edge detector;
    generating a plurality of arm position measurements from the arm position sensor by measuring a position with the arm position sensor of the robotic arm at each position of the robotic arm at which an edge point of the substrate is detected by the edge detector; and
    determining an actual position of the station based on the plurality of arm position measurements.

22. The method of claim 21, wherein determining an actual position of the station includes calculating a position of a center of the substrate from the second plurality of arm position measurements.

23. The method of claim 22, wherein determining an actual position of the station includes comparing a position of a center of the substrate with a position of a center of the blade.

24. The method of claim 22, wherein the substrate is circular.

25. The method of claim 21, wherein the station comprises a substrate transfer station for transporting substrate into or out of the microelectronic manufacturing apparatus.

26. The method of claim 21, wherein the station comprises a processing station.

27. The method of claim 26, further comprising retrieving the substrate from a substrate transfer station and delivering the substrate to the processing station before retrieving the substrate from the processing station.

28. The method of claim 26, wherein the processing station comprises an electroplating station.

29. The method of claim 21, further comprising determining a vertical position of the station.

30. The method of claim 29, wherein determining the vertical position includes moving a blade along a vertical axis toward the station and measuring a vertical position of the robotic arm when a pressure in a vacuum attaching system on the blade changes.

31. An apparatus for manufacturing integrated circuits, comprising:
    a substrate transfer station for transporting a substrate into or out of the apparatus;
    a processing station having a processing station center point;
    a robotic arm having a blade for attaching a substrate thereon;
    an arm position sensor to measure a position of the robotic arm;
    an edge detector; and
    a controller configured to
       store a default position for the edge detector,
       move the blade based on the default position of the edge detector such that at least three edge points on the blade pass through and are detected by the edge detector,
       store an arm position measurement from the arm position sensor at each position of the robotic arm at which an edge point of the blade is detected by the edge detector, and
       determine at least one of an actual position of the edge detector and an offset for measurements of the arm position sensor based on the plurality of arm position measurements.

32. The apparatus of claim 31, wherein the edge detector comprises a photo transmitter to generate a light beam and a photo detector.

33. The apparatus of claim 32, wherein the light beam generated by the photo transmitter is parallel to a rotating axis of the robotic arm.

34. The apparatus of claim 31, wherein the blade for attaching the wafer thereon has a vacuum attaching system.

35. The apparatus of claim 34, wherein the controller is configured to monitor a pressure in the vacuum attaching system to detect whether the wafer is attached to the blade.

36. The apparatus of claim 31, wherein the controller is configured to determine both the actual position of the edge detector and the offset for measurements of the arm position sensor based on the plurality of arm position measurements.

37. The apparatus of claim 31, wherein the controller is configured to calculate a position of a center of the blade from the plurality of arm position measurements.

38. The apparatus of claim 31, wherein the blade is circular.

39. The method of claim 38, wherein the controller is configured to determine at least one of the actual position of the edge detector and the offset for measurements of the arm position sensor based on the diameter of the blade.

40. The apparatus of claim 31, wherein the controller is configured to:
    store a default position for a station,
    cause the robot arm to pick up a substrate from at least one of the substrate transfer station and the processing station with the blade of the robotic arm based on the default position of the station;
    move the blade on the robotic arm such that at least three edge points on the substrate pass through and are detected by the edge detector;
    store a second arm position measurement from the arm position sensor at each position of the robotic arm at which an edge point of the substrate is detected by the edge detector, and
    determine an actual position of the station based on the second position measurements.

41. A computer product tangibly embedded on a storage medium for calibrating a controller of a robotic arm in a microelectronics manufacturing apparatus, the computer product comprising instructions to:
    store a default position for an edge detector;
    move a blade on the robotic arm based on the default position of the edge detector such that at least three edge points on the blade pass through and are detected by the edge detector;
    generate a plurality of arm position measurements from an arm position sensor by measuring a position with the arm position sensor of the robotic arm at each position of the robotic arm at which an edge point of the blade is detected by the edge detector; and
    determine at least one of an actual position of the edge detector and an offset for measurements of the arm position sensor based on the plurality of arm position measurements.

42. The computer product of claim 41, wherein the actual position of the edge detector is determined based on the plurality of arm position measurements.

43. The computer product of claim 41, wherein both the offset for measurements of the arm position sensor is determined based on the plurality of arm position measurements.

44. The computer product of claim 41, wherein both the actual position of the edge detector and the offset for measurements of the arm position sensor are determined based on the plurality of arm position measurements.

45. The computer product of claim 41, further comprising instructions to:
    store default position for a station;
    pick up a substrate from the station with the blade of the robotic arm based on the default position of the station;
    move the blade on the robotic arm such that at least three edge points on the substrate pass through and are detected by the edge detector;
    generate a second plurality of arm position measurements from the arm position sensor by measuring a position with the arm position sensor of the robotic arm at each position of the robotic arm at which an edge point of the substrate is detected by the edge detector; and
    determine an actual position of the station based on a the second plurality of arm position measurements.

* * * * *